United States Patent
Lin

(10) Patent No.: US 11,817,372 B2
(45) Date of Patent: Nov. 14, 2023

(54) HEAT SINK DEVICE

(71) Applicant: ASIA VITAL COMPONENTS CO., LTD., New Taipei (TW)

(72) Inventor: Sheng-Huang Lin, New Taipei (TW)

(73) Assignee: ASIA VITAL COMPONENTS CO., LTD., New Taipei (TW)

( * ) Notice: Subject to any disclaimer, the term of this patent is extended or adjusted under 35 U.S.C. 154(b) by 49 days.

(21) Appl. No.: 16/849,968

(22) Filed: Apr. 15, 2020

(65) Prior Publication Data

US 2021/0327785 A1 Oct. 21, 2021

(51) Int. Cl.
*H01L 23/427* (2006.01)
*F28D 15/04* (2006.01)
*F28D 15/02* (2006.01)
*F28D 5/02* (2006.01)

(52) U.S. Cl.
CPC ........ *H01L 23/427* (2013.01); *F28D 15/0275* (2013.01); *F28D 15/04* (2013.01)

(58) Field of Classification Search
CPC . H01L 23/427; H01L 23/467; H05K 7/20336; F28D 15/02; F28D 15/04; F28D 15/0266; F28D 15/0233
See application file for complete search history.

(56) References Cited

U.S. PATENT DOCUMENTS

| | | | |
|---|---|---|---|
| 7,245,494 B2 * | 7/2007 | Cheng | F28D 15/0275 174/15.2 |
| 7,967,059 B2 * | 6/2011 | Li | H01L 23/3672 165/80.3 |
| 8,109,322 B2 * | 2/2012 | Huang | H01L 23/427 165/80.3 |
| 2009/0059524 A1 * | 3/2009 | Peng | H01L 23/427 361/709 |
| 2009/0161316 A1 * | 6/2009 | Xu | H01L 23/467 165/104.33 |

(Continued)

FOREIGN PATENT DOCUMENTS

| | | |
|---|---|---|
| CN | 106686942 A | 5/2017 |
| CN | 211720962 U | 10/2020 |
| TW | 200836616 A | 9/2008 |

(Continued)

OTHER PUBLICATIONS

Search Report dated May 24, 2022 issued by China National Intellectual Property Administration for counterpart application No. 2020102318353.

(Continued)

*Primary Examiner* — Tavia Sullens
*Assistant Examiner* — Khaled Ahmed Ali Al Samiri
(74) *Attorney, Agent, or Firm* — Demian K. Jackson; Jackson IPG PLLC

(57) ABSTRACT

A heat sink device, comprising a body, at least a heat pipe, and a base. The body has a first side and a second side onto which a heat source is attached. The heat pipe has a heat-absorbing portion and a heat-dissipating portion. The heat-absorbing portion is attached to the first side, while the heat-dissipating portion is away from the heat-absorbing portion, so that the heat generated by the heat source is absorbed by the heat-absorbing portion and transferred to the distal end of the heat-dissipating portion. The base is disposed on the heat pipe and above the body.

4 Claims, 8 Drawing Sheets

(56) References Cited

U.S. PATENT DOCUMENTS

2009/0266518 A1* 10/2009 Huang ............... F28D 15/0275
165/104.19
2017/0198980 A1    7/2017 Lan

FOREIGN PATENT DOCUMENTS

| TW | I322258  | 3/2010 |
| TW | M453833  | 5/2013 |
| TW | M574818  | 2/2019 |
| TW | M597424  | 6/2020 |

OTHER PUBLICATIONS

Search Report dated Aug. 25, 2020 issued by Taiwan Intellectual Property Office for counterpart application No. 109110606.

* cited by examiner

HEAT SINK DEVICE

BACKGROUND OF THE INVENTION

1. Field of the Invention

The present invention relates to a heat sink device, and particularly to a heat sink device that significantly increases heat transfer and dissipation efficiency.

2. Description of the Related Art

As semiconductor technology progresses, the size of an integrated circuit is getting smaller. For the purpose of processing more data, the integrated circuit with a given size has been able to contain computing components several times more than before. As more and more computing components are contained in the integrated circuit, the performance of the integrated circuit is getting higher, so the heat generated when the computing components operate is getting hotter. For example, the heat generated by a common central processing unit (CPU) at its full workloads is enough to burn the whole CPU. Therefore, heat transfer components in the integrated circuit become a crucial element.

A CPU, chips, or other electronic components in an electronic device can be a heat source of the device, which generates heat when the electronic device is running. Hence, heat transfer components with a good heat transfer and dissipation effect, such as a heat pipe, vapor chamber, and flat heat pipe, etc., is generally used currently to transfer heat with equivalent temperature. The heat pipe is mostly used for distal end heat transfer, which absorbs heat by its one end (a heat-absorbing end), converts a working fluid therein from liquid to vapor, and transfer the heat to the other end of the heat pipe (a heat-dissipating end) so as to remove heat. The vapor chamber, on the other hand, is selected to be the heat component in the situation that a large heat transfer area is needed. Generally, the vapor chamber absorbs heat via a side surface in contact with a heat source and transfers the heat to the corresponding other side where the heat dissipates and condensation takes place.

However, a heat pipe, vapor chamber, etc. from the conventional heat transfer components belong to a single solution (with only one heat transfer ability of equivalent temperature or distal end heat transfer). That is, the conventional heat transfer components disposed in an electronic device can only transfer heat to the distal end or with equivalent temperature for the heat pipe or vapor chamber that is in contact with a heat source, but cannot transfer heat with these two effects, thereby causing that heat exchange efficiency is relatively low.

Therefore, how to solve the above-mentioned issues and shortcomings becomes a goal for the inventor of the present invention and associated practitioners in the art to study and improve.

SUMMARY OF THE INVENTION

Accordingly, for addressing the shortcomings of the prior art, the first object of the present invention is to provide a heat sink device that significantly increases heat transfer efficiency.

The second object of the present invention is to provide a heat sink device that significantly increases heat dissipation efficiency.

To achieve the above-mentioned objects, the present invention provides a heat sink device that is attached onto a heat source on its one side, the heat sink device comprises a body, at least a heat pipe, and a base. The body has a first side and a second side onto which a heat source is attached. The heat pipe has a heat-absorbing portion and a heat-dissipating portion. The heat-absorbing portion is attached to the first side, while the heat-dissipating portion is away from the heat-absorbing portion, so that the heat generated by the heat source is absorbed by the heat-absorbing portion and transferred to the distal end of the heat-dissipating portion. The base is disposed on the heat pipe and above the body.

Therefore, through the configuration design in which the second side of the body is attached onto the heat source and the heat pipe is disposed between the base and the body, the present invention, utilizing large area heat transfer from the body as well as distal end heat transfer from the heat pipe, significantly increases the heat transfer and dissipation efficiency of the heat sink device as a whole.

DETAILED DESCRIPTION OF THE PREFERRED EMBODIMENTS

Figure 1:
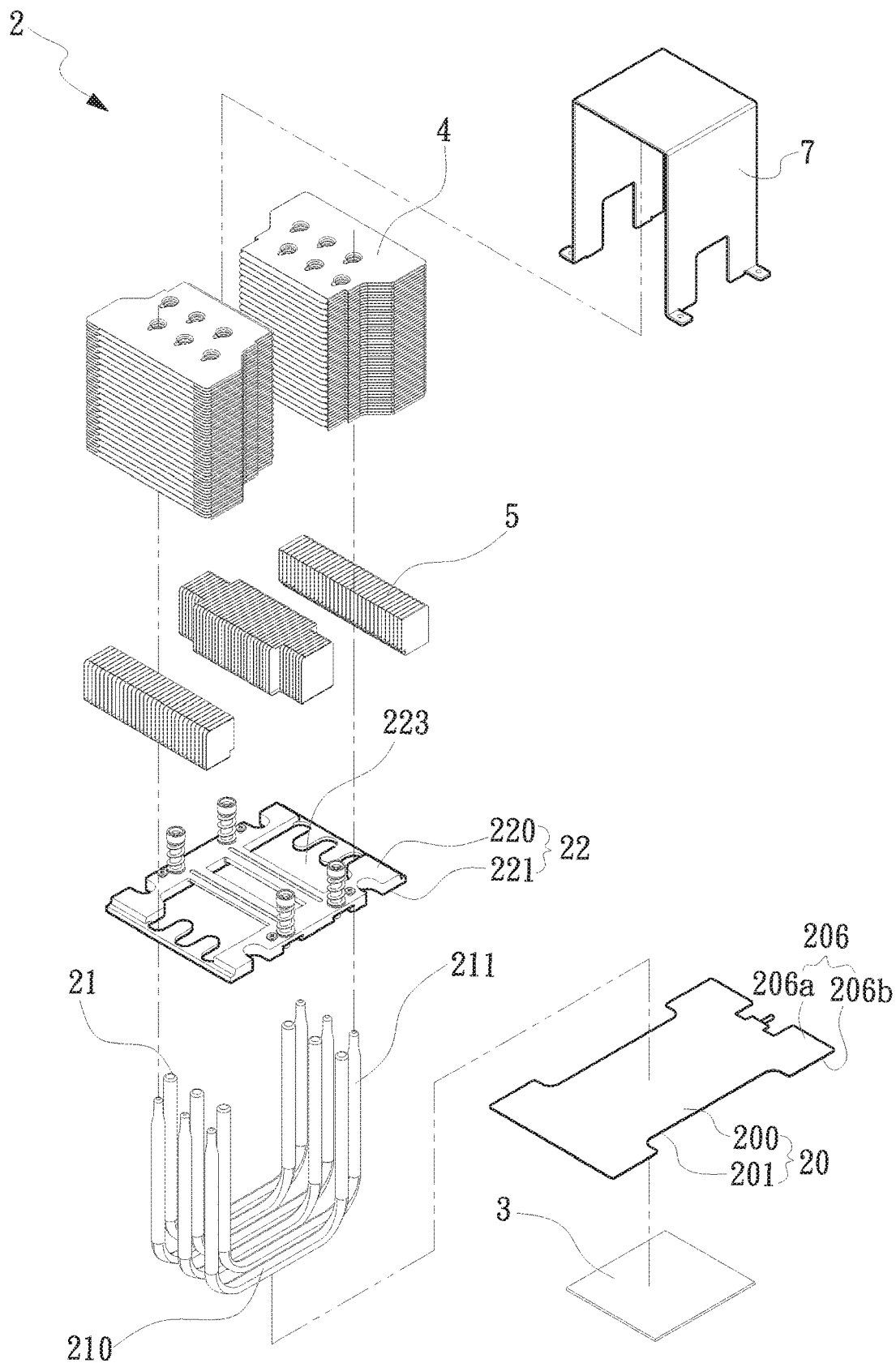
FIG. 1 is an exploded perspective view of the first embodiment of a heat sink device of the present invention.
Figure 2:
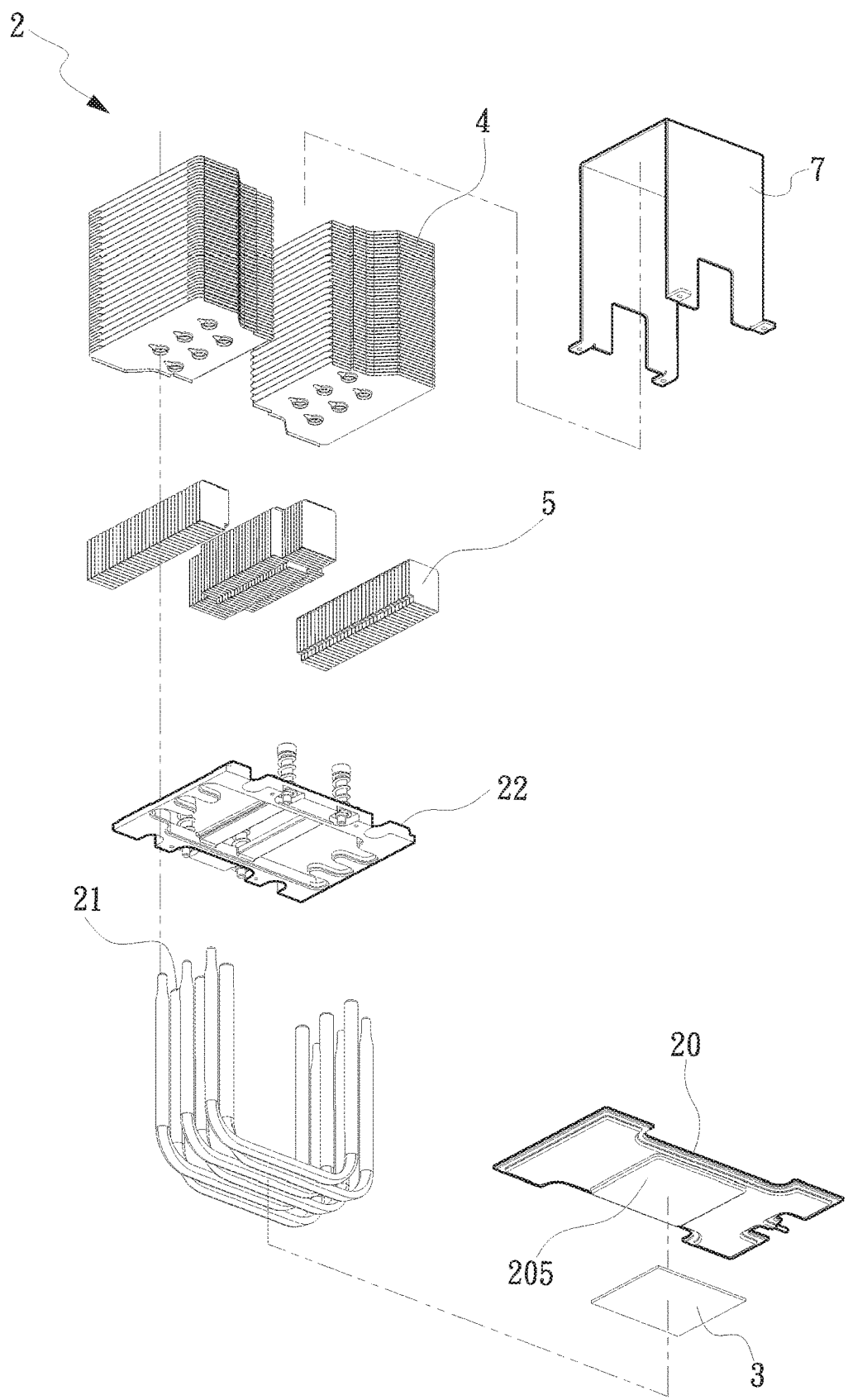
FIG. 2 is another exploded perspective view of the first embodiment of the heat sink device of the present invention.
Figure 3:
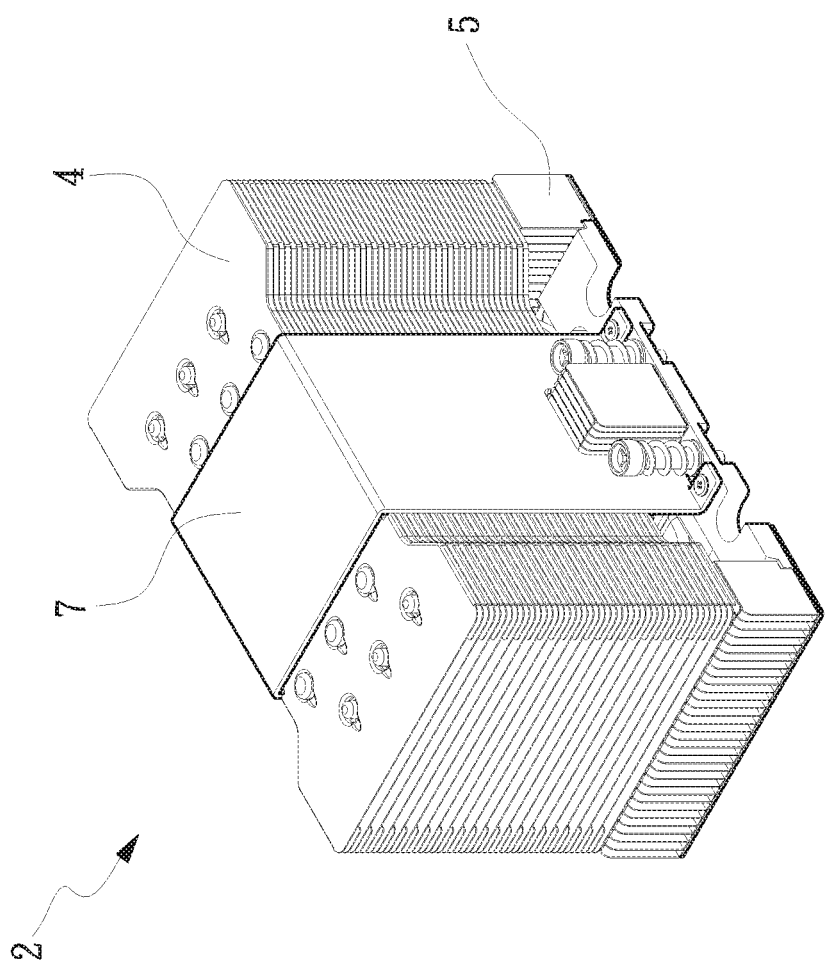
FIG. 3 is a perspective view of the heat sink device of the first embodiment of the present invention.
Figure 4:
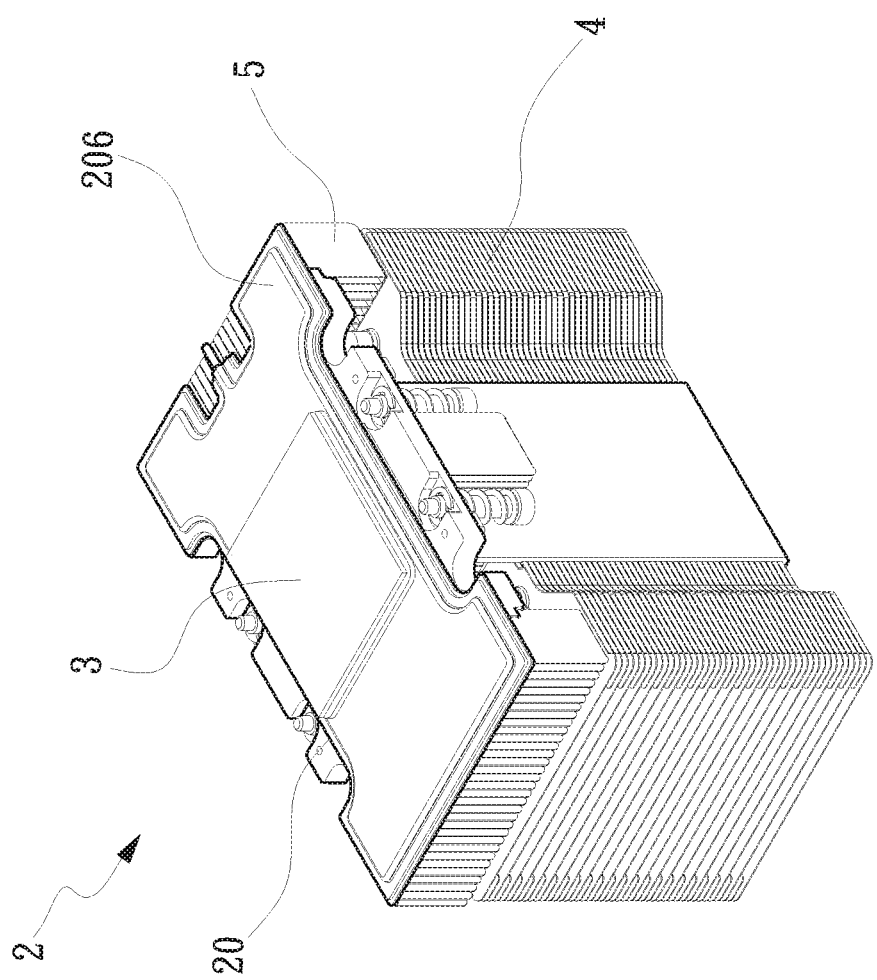
FIG. 4 is another perspective view of the heat sink device of the first embodiment of the present invention.

The above-mentioned objects and the structure and functions of the present invention are to be illustrated with reference to the preferred embodiments in the accompanying drawings.

Referring to FIGS. 1-5, they are figures of the first embodiment of a heat sink device of the present invention. As shown, a heat sink device 2 that is attached onto a heat source 3 on its one side includes a body 20, at least a heat pipe 21, and a base 22. The body 20 that can be made of Au, Ag, Cu, Al, stainless steel, Ti, or ceramics, is implemented as a vapor chamber. It is to be explained first, in other embodiments a heat transfer plate can be selected to be the body 20.

Figure 5:
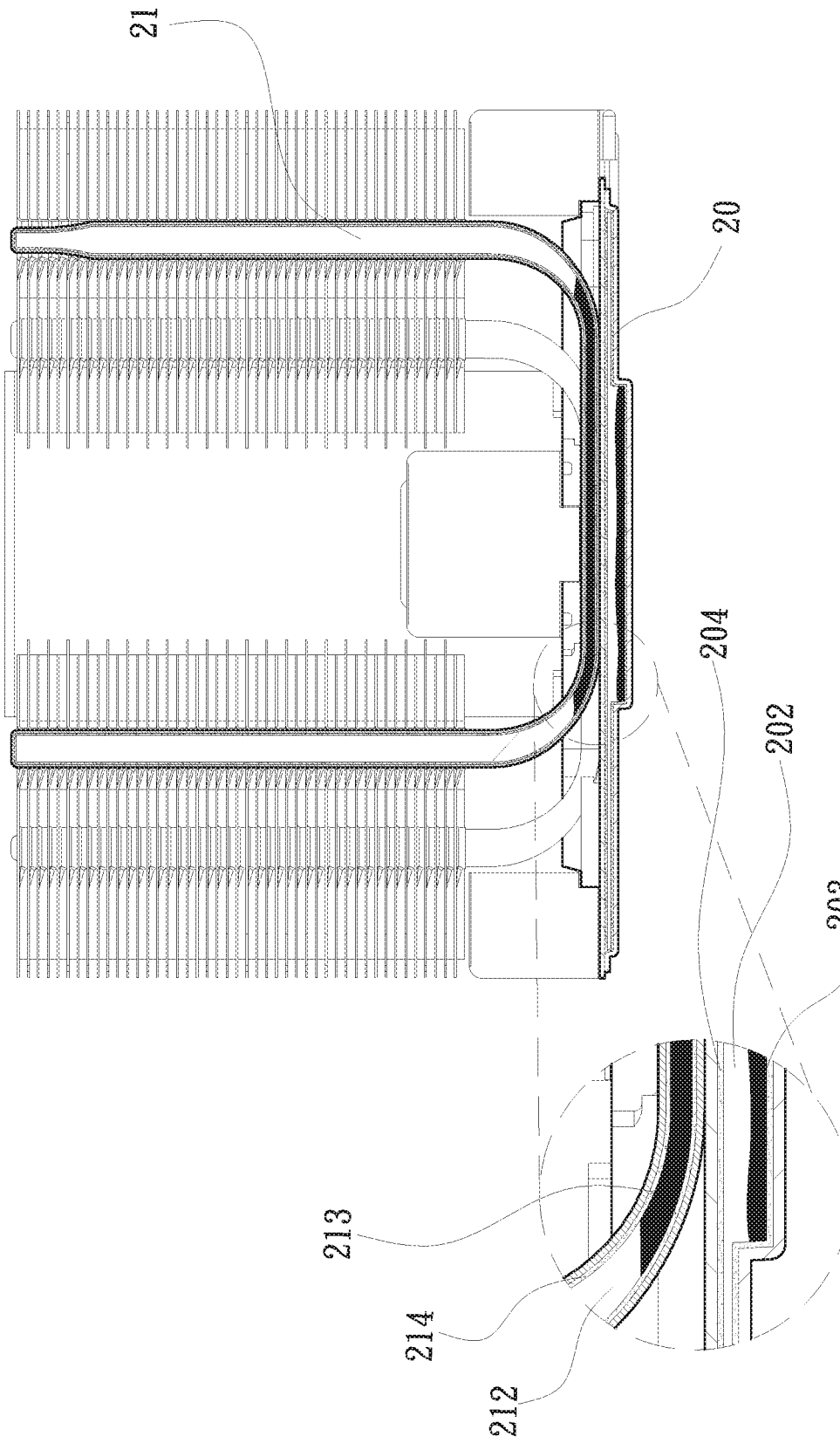
FIG. 5 is a side cross-sectional view of the heat sink device of the first embodiment of the present invention.

The body 20 has a first side 200 and a second side 201 that collectively define a body chamber 202 (referring to FIG. 5). The body chamber 202 is provided with a first working fluid 203 and a body capillary wick 204 that is formed on the whole or part of inner wall of the body chamber 202. The second side 201 is in contact with the heat source 3.

The heat pipe 21 can be U, L, I shaped, and in this embodiment is implemented as a U shape. The heat pipe 21 has a heat-absorbing portion 210 and a heat-dissipating portion 211, as well as a heat pipe chamber 212 (referring to FIG. 5). The heat chamber 212 is provided with a second working fluid 213 and a heat pipe capillary wick 214 that is formed on the inner wall of the heat pipe chamber 212. The heat-absorbing portion 210 is disposed on the first side 200 of the body 20.

The base 22 has an upper surface 220, a lower surface 221, and a hollow portion 223 that is formed through the base 22 from the upper surface 220 to the lower surface 221. The heat pipe 21 extends through the hollow portion 223 and attaches the heat-absorbing portion 210 onto the first side 200 of the body 20. The second side 201 of the body 20 protrudes to form a boss 205 onto which the heat source 3 is attached.

In addition, the heat sink device 2 further includes at least a first cooling fin set 4 through which the heat-dissipating portion 211 of the heat pipe 21 extends. Hence, the heat generated by the heat source 3 is absorbed by the heat-absorbing portion 210 of the heat pipe 21 and is transferred to the heat-dissipating portion 211, and the first cooling fin set 4 through which the heat-dissipating portion 211 extends then transfers heat to the outside where heat exchange takes place.

Furthermore, the heat sink device 2 further includes a cover 7 that covers a gap in the middle of the first cooling fin set 4 and is fixed on the base 22. The cover 7 can block airflow from the outside, as well as prevent airflow inside the first cooling fin set 4 from leaking, which takes out the heat from the heat source 3 more quickly so as to improve the heat dissipation ability of the heat sink device 2 as a whole.

Figure 6:
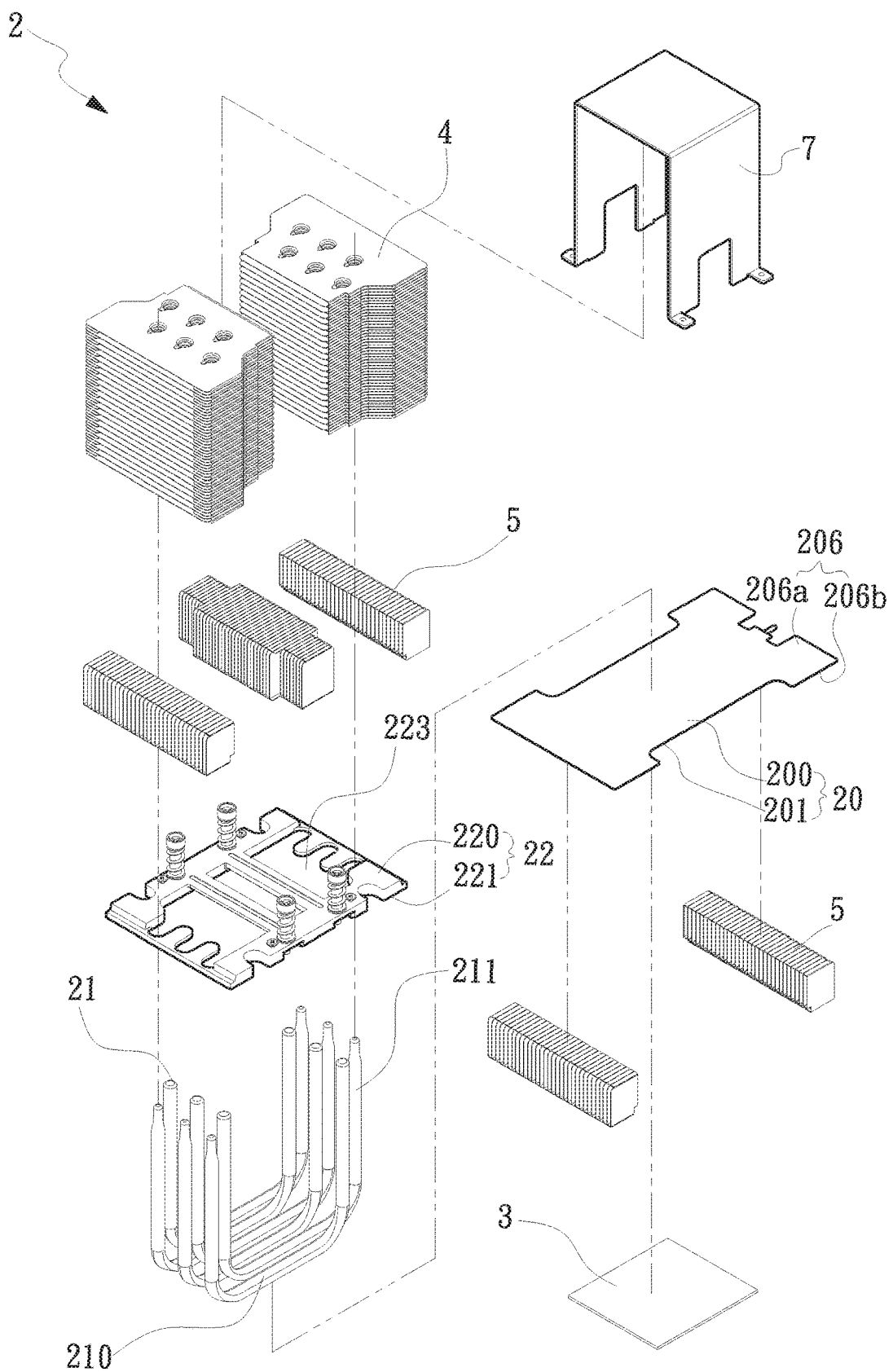
FIG. 6 is an exploded perspective view of the heat sink device of the second embodiment of the present invention.

Continue to FIG. 1, the body 20 further extends outwardly to form an extension portion 206 that has an upper side 206a and a lower side 206b. At least a second cooling fin set 5 is disposed on the upper side 206a of the body 3 (or in other embodiments disposed on the lower side 206b (not shown)). Alternatively, the second cooling fin set 5 can be disposed on one side of the extension portion 206, or on the upper side 206a and lower side 206b of the extension portion simultaneously (the second embodiment of the present invention as shown in FIG. 6). Through the second cooling fin set 5, the heat generated by the heat source 3 can be spread out, more rapidly, to the outside where heat exchange takes place, thereby increasing the heat dissipation efficiency of the heat sink device 2 as a whole.

Therefore, through the configuration design in which the second side 201 of the body 20 is attached onto the heat source 3, the heat pipe is disposed between the base 22 and the body 20, and the heat-absorbing portion 210 is in direct contact with the first side 200 of the body 20, the present invention can, utilizing large area heat transfer from the body 20 as well as distal end heat transfer from the heat pipe 21, significantly increase the heat transfer and dissipation efficiency of the heat sink device 2 as a whole.

Figure 7:
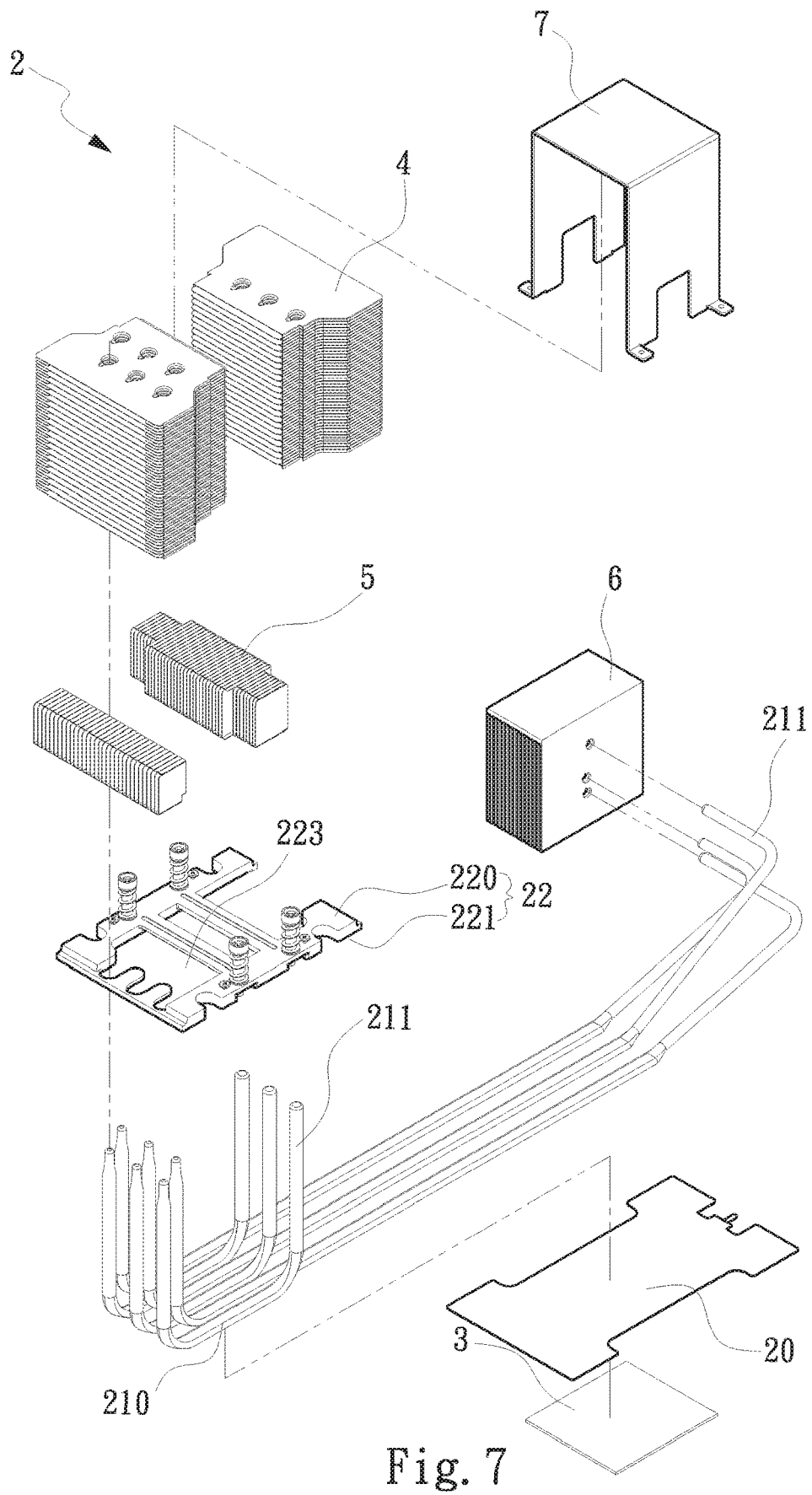
FIG. 7 is an exploded perspective view of the heat sink device of the third embodiment of the present invention.

Referring now to FIG. 7, which is the third embodiment of the heat sink device of the present invention, the main difference between the third embodiment and the above embodiments is that some portions of the heat-absorbing portion 210 of the heat pipe 21 are disposed perpendicularly to the heat-dissipating portion 211, some portions are not, i.e., some portions of the heat-dissipating portion 211 extends obliquely outward from the heat-absorbing portion 210. A third cooling fin set 6 is disposed on the heat-dissipating portion 211 that extends obliquely outward.

Figure 8:
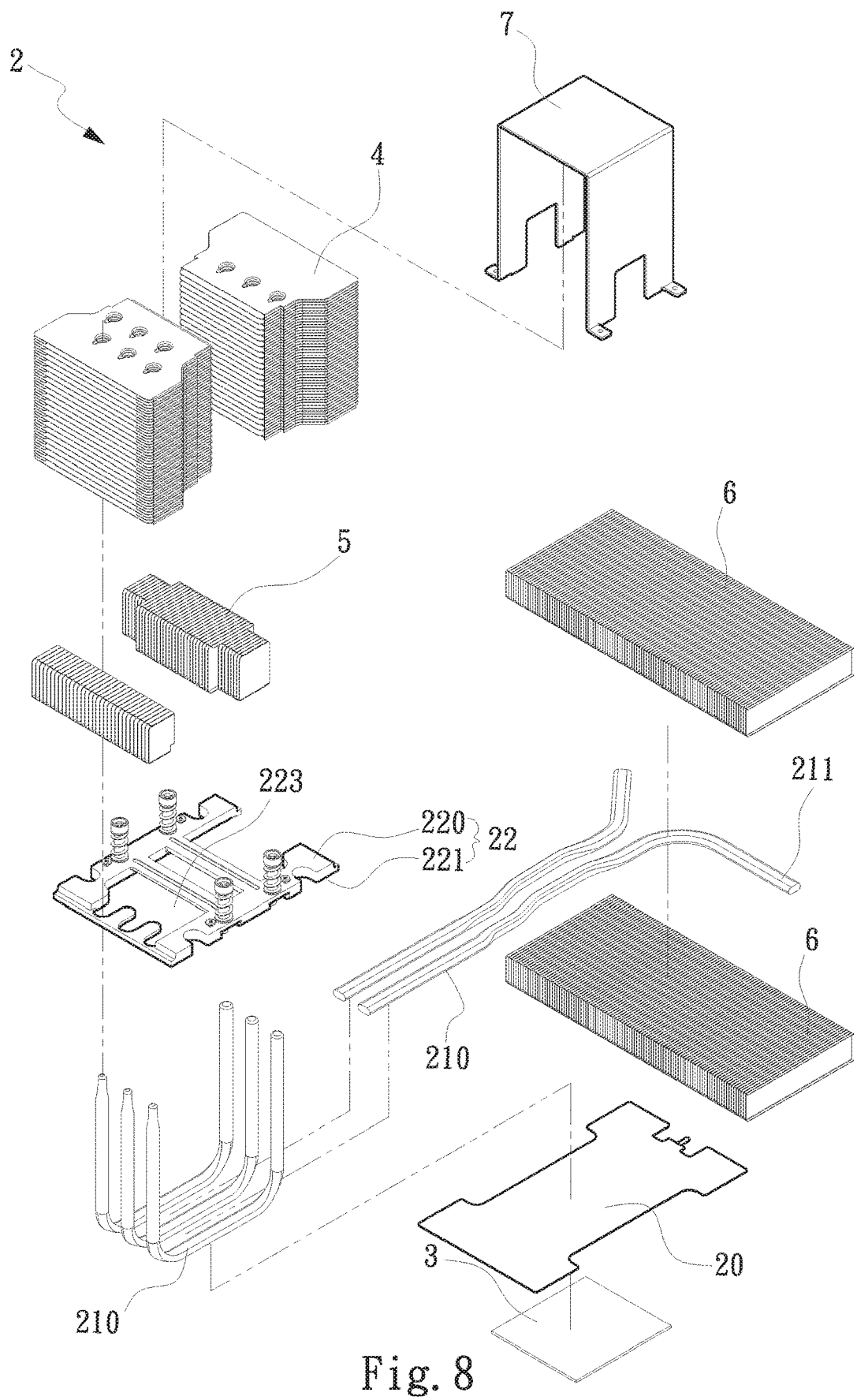
FIG. 8 is an exploded perspective view of the heat sink device of the fourth embodiment of the present invention.

In addition, as shown in FIG. 8, the heat pipe 21 can also be "L" or "I" shaped in which the heat-absorbing portion 210 is attached to the body 20, and the heat-dissipating portion 211 is disposed between the third cooling fin set 6. After the heat from the heat source 3 is spread with equivalent temperature horizontally and rapidly by the body 20, the heat is transferred to the heat-dissipating portion 211 of the heat pipe 21 and then dissipated by the third cooling fin set 6. The effect of distal end heat transfer is therefore achieved.

In summary, the present invention has advantages than the prior art as follow:
 1. Significantly increase heat transfer efficiency;
 2. Significantly increase heat dissipation efficiency.

While the present invention is described in detail above, those described are merely the preferred embodiments of the present invention, which is not intended to limit the scope of the present invention. This is, equivalent variations and modifications that fall within the scope of the present invention shall be deemed to be included in the present invention.

What is claimed is:

1. A heat sink device comprising:
 a body having a first side and a second side onto which a heat source is attached, the body being a vapor chamber or a heat transfer plate having a chamber, wherein the body further extends outwardly to form an extension portion that has an upper side connected to the first side of the body and a lower side connected to the second side of the body that together define a body chamber, the body chamber being provided with a first working fluid and a body capillary wick formed on an inner wall of the body chamber;
 at least a first cooling fin set disposed on the upper side;
 at least a heat pipe having a heat-absorbing portion and a heat-dissipating portion, the heat-absorbing portion attached to the first side, the heat-dissipating portion extends away from the heat-absorbing portion and is inserted through the first cooling fin set, so that the heat generated by the heat source is absorbed by the heat-absorbing portion and transferred to an end of the heat-dissipating portion;
 a base disposed on the heat pipe and above the body and having a center hollow window;
 a plurality of second cooling fin sets located below the first cooling fin set, wherein at least two of the plurality of second cooling fin sets are arranged on each of the upper and/or lower sides of the extension portion of the main body and wherein one of the plurality of second cooling fin sets is disposed at a central portion of the base and has a bottom convex portion that contacts the heat-absorbing portion of the heat pipe through the center hollow window of the base: and
 a cover covering a gap in the middle of the first cooling fin set and fixed on the base, and the first cooling fin set having an uncovered part and the heat pipe being not covered by the cover, thereby the heat generated by the heat source is absorbed by the heat-absorbing portion of the heat pipe and transferred to the heat-dissipating portion, and the heat is thereby transferred through the first cooling fin set to an external environment.

2. The heat sink device of claim 1, wherein the base has an upper surface and a lower surface and wherein the center hollow window is formed through the base from the upper surface to the lower surface and the heat pipe extends across the center hollow window and attaches the heat-absorbing portion onto the first side of the body.

3. The heat sink device of claim 1, wherein the second side of the body protrudes to form a boss onto which the heat source is attached.

4. The heat sink device of claim 1, wherein the heat pipe is "U", "L", or "I" shaped.

* * * * *